(12) United States Patent
Heremans et al.

(10) Patent No.: US 6,512,369 B2
(45) Date of Patent: Jan. 28, 2003

(54) TEMPERATURE COMPENSATED VOLTAGE DIVIDER WITH A MAGNETORESISTOR AND A REFERENCE RESISTOR

(75) Inventors: Joseph Pierre Heremans, Troy, MI (US); Dale Lee Partin, Ray Township, MI (US); Thaddeus Schroeder, Rochester Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/862,659

(22) Filed: May 22, 2001

(65) Prior Publication Data

US 2002/0175680 A1 Nov. 28, 2002

(51) Int. Cl.[7] .......................... G01R 33/09; H01L 43/08
(52) U.S. Cl. ...................... 324/252; 257/201; 257/425; 338/32 R
(58) Field of Search .......................... 324/205, 207.12, 324/207.21, 207.22, 207.24, 207.25, 252; 338/32 R; 360/313–318; 257/425, 201

(56) References Cited

U.S. PATENT DOCUMENTS

| | | | | |
|---|---|---|---|---|
| 4,401,966 A | * | 8/1983 | Ohmura et al. | 338/32 R |
| 4,751,555 A | * | 6/1988 | Alferness et al. | 357/16 |
| 5,038,130 A | * | 8/1991 | Eck et al. | 338/32 R |
| 5,144,379 A | * | 9/1992 | Eshita et al. | 357/22 |
| 5,349,201 A | * | 9/1994 | Stanchina et al. | 257/18 |
| 5,502,325 A | * | 3/1996 | Sokolich et al. | 257/421 |
| 6,031,256 A | * | 2/2000 | Liu et al. | 257/198 |
| 6,204,513 B1 | * | 3/2001 | El-Zein et al. | 257/14 |

* cited by examiner

Primary Examiner—Edward Lefkowitz
Assistant Examiner—Reena Aurora
(74) Attorney, Agent, or Firm—Margaret A. Dobrowitsky

(57) ABSTRACT

A magnetoresistor voltage divider includes a bottom layer disposed on a substrate. A middle layer is disposed on the bottom layer. A top layer is disposed on the middle layer. The bottom and top layer are resistive layers and the middle layer is an insulating layer. A common terminal is connected to the bottom layer and the top layer. A reference resistor terminal is connected to the bottom layer only. Moreover, a sensing MR terminal is connected to the top layer only. Accordingly, a sensing MR is established between the common terminal and the sensing MR terminal and a reference resistor is established between the common terminal and the reference resistor terminal. Thus, the sensing MR is stacked on top of the reference resistor.

15 Claims, 1 Drawing Sheet

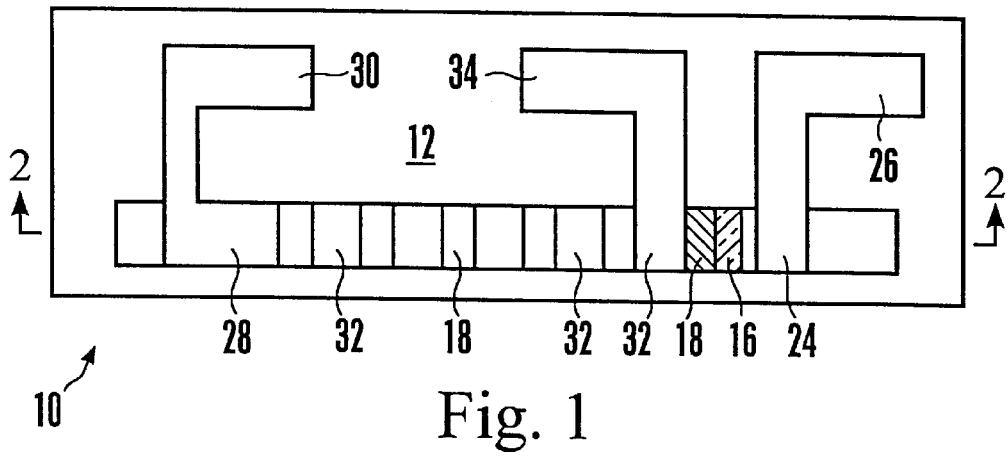
Fig. 1
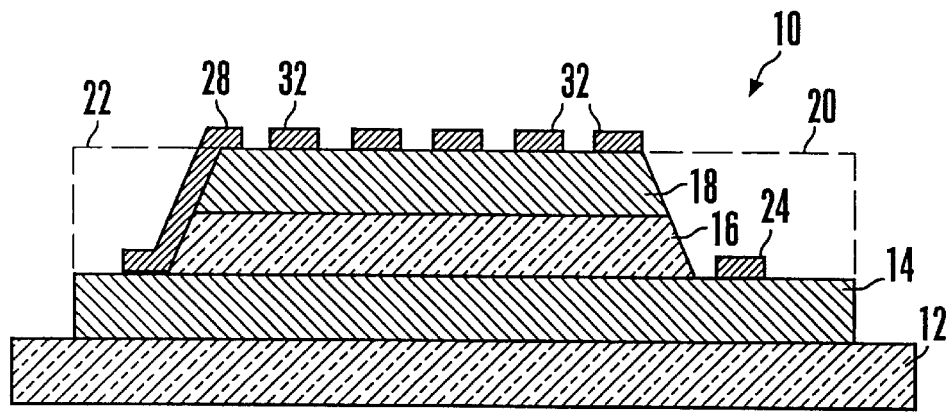
Fig. 2
Fig. 3
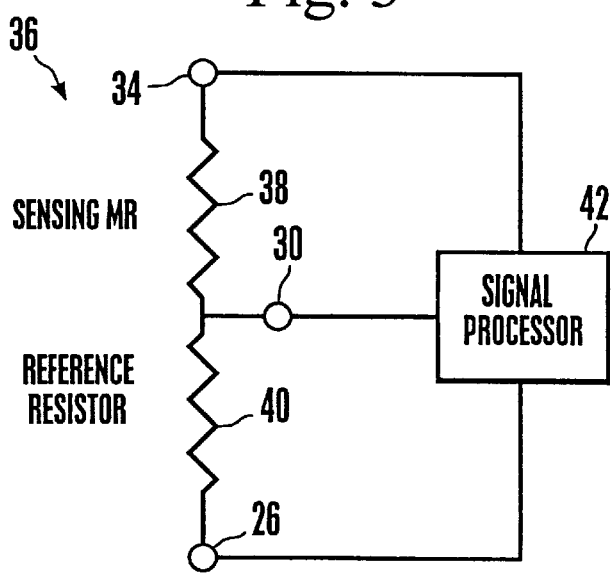

US 6,512,369 B2

TEMPERATURE COMPENSATED VOLTAGE DIVIDER WITH A MAGNETORESISTOR AND A REFERENCE RESISTOR

TECHNICAL FIELD

The present invention relates generally to magnetic field sensors and more specifically to magnetoresistors.

BACKGROUND OF THE INVENTION

Modern motor vehicles are equipped with numerous sensor assemblies that are used to determine the relative position of a moving part, such as a steering column, to a stationary part, such as the vehicle chassis. These sensor assemblies can include a magnet for creating a magnetic field and a magnetoresistor (MR) for sensing the magnetic field and any changes thereto. It happens that indium-antimonide (InSb) MRs are extremely sensitive to magnetic fields. Unfortunately, they are also very temperature dependant. In order to compensate for the temperature dependency, an InSb MR can be incorporated into a voltage divider with another InSb resistor that has a similar temperature dependance, but does not have any magnetic field dependence. The second InSb resistor acts as a reference resistor.

It is advantageous to integrate both InSb resistors on the same substrate to create a single circuit chip. To double the voltage output and hence increase the signal strength, two of these voltage dividers can be connected together to make a Wheatstone bridge. A common to do this is to make the MR out of an InSb film patterned with magnetic shorting bars that short out the Hall voltage and create the geometric magnetoresistive effect. The reference resistor is made out of the same InSb film sans the shorting bars. Then, both InSb resistors are connected together to make a voltage divider. Two of these voltage dividers can then be connected together to create the Wheatstone bridge.

As recognized by the present invention, the above approach has two major disadvantages. First is that the reference resistor has an intrinsic magnetoresistance that, although being smaller than that of the geometric resistance, it is nonetheless significant and is temperature dependant. As a result, the temperature compensation effect of the MR/reference resistor pair becomes dependant on the magnetic field and does not work properly over a useful range of magnetic fields. The second major disadvantage is that the reference resistor takes up space on the semiconductor die and nearly doubles the area necessary to make the magnetic sensor assembly described above. Thus, the cost and size of the die is increased.

The present invention has recognized these prior art drawbacks, and has provided the below-disclosed solutions to one or more of the prior art deficiencies.

SUMMARY OF THE INVENTION

A magnetoresistor voltage divider includes a reference resistor and a sensing magnetoresistor. The sensing magnetoresistor is disposed on top of the reference resistor in a single circuit chip.

In a preferred embodiment, the magnetoresistor voltage divider includes a bottom layer, a middle layer disposed on the bottom layer, and a top layer disposed on the middle layer. Also, the magnetoresistor voltage divider includes a common terminal that electrically connects the bottom layer to the top layer. A reference resistor terminal is connected to the bottom layer; and a sensing MR terminal is connected to the top layer. Preferably, the reference resistor is established between the common terminal and the reference resistor terminal. The sensing magnetoresistor is established between the common terminal and the sensing terminal. In a preferred embodiment, the bottom layer and the top layer are resistive layers, and the middle layer is an insulating layer.

Preferably, the magnetoresistor voltage divider further includes plural top layer shorting bars disposed on the top layer. Also, in a preferred embodiment, the bottom layer is disposed on a substrate. Preferably, the bottom layer and the top layer are made from indium-antimonide (InSb) or indium-arsenide (InAs). On the other hand, the middle layer is made from one of: undoped gallium arsenide (GaAs), slightly p-doped gallium arsenide (GaAs), indium phosphide (InP), gallium antimodide (GaSb), indium gallium antimonide (InGaSb), and indium aluminum antimonide (InAlSb).

In another aspect of the present invention, a method for making a magnetoresistor voltage divider includes providing an substrate and disposing a bottom layer on the substrate. A middle layer is disposed on the bottom layer and a top layer is disposed on the middle layer. In this aspect, the substrate and the middle layer are made from an insulating material. The bottom layer and top layer are made from a resistive material. The method also includes connecting a reference resistor terminal to the bottom layer. A common terminal is connected to the middle layer and the top layer. Moreover, a sensing MR terminal is connected to the top layer.

In yet another aspect of the present invention, a magnetoresistor sensor includes a substrate and a bottom resistive layer on the substrate. The sensor also includes a top resistive layer that is spaced and insulated from the bottom layer and electrically connected thereto. A common terminal is electrically connected to the top and bottom layers. A sensing MR terminal is electrically connected to only the top layer. Also, a reference resistor terminal electrically connected to only the bottom layer. In this aspect, a sensing magnetoresistor is established between the common terminal and the sensing MR terminal. Moreover, a reference resistor is established between the common terminal and the reference resistor terminal.

The present invention will now be described, by way of example, with reference to the accompanying drawings, in which:

BRIEF DESCRIPTION OF THE DRAWINGS

FIG. 1 is top view of a temperature compensated magnetoresistor voltage divider;

FIG. 2 is a cross-section view of the temperature compensated magnetoresistor voltage divider taken along line 2—2 in FIG. 1; and FIG. 3 is circuit diagram representing the magnetoresistor voltage divider shown in FIGS. 1 and 2.

DESCRIPTION OF AN EMBODIMENT OF THE INVENTION

Referring to FIGS. 1 and 2, a temperature compensated magnetoresistor (MR) voltage divider is shown and generally designated 10. FIGS. 1 and 2 show that the MR voltage divider 10 includes an insulating substrate 12 on which a bottom layer 14 is deposited. A middle layer 16 is deposited on the bottom layer 14. Moreover, a top layer 18 is deposited on the middle layer 16. Preferably, the layers 14, 16, 18 are deposited, or grown, epitaxially, but it is to be appreciated that any means well known in the art can be used. In a preferred embodiment, the insulating substrate 12 is gallium arsenide (GaAs). Preferably, the bottom layer 14 and top layer 18 are made from n-type doped indium-antimonide (InSb) and the middle layer 16 is made from an electrically insulating material, e.g., undoped or slightly p-doped gallium arsenide (GaAs), indium phosphide (InP), gallium antimodide (GaSb), indium gallium antimonide (InGaSb), or indium aluminum antimonide (InAlSb). It is to be understood that the bottom layer 14 and top layer 18 can also be n-type doped indium-arsenide (InAs). It is also to be understood that the materials listed for the layers 12, 14, 16, 18 are intended to be illustrative and not comprehensive.

In a preferred embodiment, after the layers 14, 16, 18 are deposited on the substrate 12, photolithography is used to define the finished structure. The upper two layers, i.e., the middle layer 16 and the top layer 18, are etched away in two places to expose the bottom layer 14 and create a flat-topped, pyramid shaped "mesa" as shown. The material removed by this etching process is represented by dashed line 20 and dashed line 22.

As shown in FIGS. 1 and 2, a single bottom layer conductor pad 24 is disposed on the bottom layer 14 and does not contact the middle layer 16 or the top layer 18. The bottom layer conductor pad 24 extends across the substrate 12 to form a reference resistor terminal pad 26 that is connected to a signal processor, described below. FIGS. 1 and 2 further shows a layer-connecting shorting bar 28 disposed on the MR voltage divider 10 from the top of the bottom layer 14, across the middle layer 16, and to the top layer 18. The layer-connecting shorting bar 28 spans the insulating middle layer and electrically connects the bottom layer to the top layer 18. As shown in FIGS. 1 and 2, a common terminal pad 30 is connected to the layer-connecting shorting bar 28. The common terminal pad 30 is disposed on or is otherwise incorporated into the upper surface of the substrate 12. As described in detail below, the common terminal pad 30, in turn, is connected to the signal processor.

FIGS. 1 and 2 also show plural top layer shorting bars that are 32 disposed on top of the top layer 18 to complete the sensing MR. A sensing MR terminal pad 34 is connected to at least one of the top layer shorting bars 32 and is disposed on the substrate. It is to be appreciated that the terminal pads 26, 30, 34 are metallic pads disposed on, attached to, or otherwise incorporated into the upper surface of the substrate 12. In a preferred embodiment, electrical contact to the terminal pads 26, 30, 34 is achieved using a wire bond or a small drop of conducting epoxy. It is to be also appreciated that in a preferred embodiment, the shorting bars 24, 28, 32 are made from a metal film that can be evaporated onto the layers 14, 16, 18 at the appropriate places, described above.

Referring to FIG. 3, a circuit diagram representing the structure described above is shown and designated 36. FIG. 3 shows that the circuit diagram includes a sensing MR 38 that, in a preferred embodiment, is connected in series to a reference resistor 40. It is to be appreciated that the sensing MR 38 is established between the common terminal 30 and the sensing MR terminal 34. On the other hand, the reference resistor 40 is established between the reference resistor terminal 26 and the common terminal 30. As shown in FIG. 3, the terminals 26, 30, 34 are connected to a signal processor 42 in which an appropriate signal processing circuit is established. It is to be understood that the sensing MR 38 generates a temperature-dependent magnetic field signal and the reference resistor 40 generates a reference signal useful for removing temperature dependencies from the magnetic field signal. The signal processor 42 receives both signals and corrects the magnetic field signal based on the reference signal. The magnetic field signal can be used to detect the relative motion between a stationary part and a moving part.

With the configuration of structure described above, it is to be appreciated that the temperature compensated MR voltage divider 10 is oriented vertically in the same circuit chip, i.e., the sensing MR 38 is "stacked" on top of the reference resistor 40. Thus, the size of the manufacturing die is reduced. Moreover, the doping levels and/or the thicknesses of the bottom layer 14 and the top layer 18 can be adjusted so that the resistance of the sensing MR 38 matches the resistance of the reference resistor 40 for various temperatures over a useful range of magnetic field values.

While the particular TEMPERATURE COMPENSATED MAGNETORESISTOR VOLTAGE DIVIDER as herein shown and described in detail is fully capable of attaining the above-described objects of the invention, it is to be understood that it is the presently preferred embodiment of the present invention and thus, is representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it is to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. section 112, sixth paragraph, unless the element is expressly recited using the phrase "means for."

What is claimed is:

1. A magnetoresistor voltage divider, comprising:
   at least a bottom layer;
   at least a middle layer disposed on the bottom layer;
   at least a top layer disposed on the middle layer;
   a common terminal electrically connecting the bottom layer to the top layer;
   a reference resistor terminal connected to the bottom layer; and
   a sensing MR terminal connected to the top layer, a reference resistor being established between the common terminal and the reference resistor terminal, a sensing magnetoresistor being established between the common terminal and the sensing terminal.

2. The magnetoresistor voltage divider of claim 1, wherein the bottom layer and the top layer are resistive layers, and the middle layer is an insulating layer.

3. The magnetoresistor voltage divider of claim 2, further comprising:
   plural top layer shorting bars disposed on the top layer.

4. The magnetoresistor voltage divider of claim 1, wherein the bottom layer is disposed on a substrate.

5. The magnetoresistor voltage divider of claim 1, wherein the bottom layer and the top layer are made from indium-antimonide (InSb).

6. The magnetoresistor voltage divider of claim 5, wherein the middle layer is made from one of: undoped gallium arsenide (GaAs), slightly p-doped gallium arsenide (GaAs), indium phosphide (InP), gallium antimodide (GaSb), indium gallium antimonide (InGaSb), and indium aluminum antimonide (InAlSb).

7. A method for making a magnetoresistor voltage divider, comprising the acts of:
   providing an substrate;
   disposing a bottom layer on the substrate;
   disposing a middle layer on the bottom layer;
   disposing a top layer on the middle layer, the substrate and the middle layer being made from an insulating material, the bottom layer and top layer being made from a resistive material;
   connecting a reference resistor terminal to the bottom layer;
   connecting a common terminal to the middle layer and the top layer; and
   connecting a sensing MR terminal to the top layer.

8. The method of claim 7, wherein a reference resistor is established between the common terminal and the reference resistor terminal and a sensing magnetoresistor is established between the common terminal and the sensing MR terminal.

9. The method of claim 7, wherein the bottom layer and the top layer are made from one of: indium-antimonide (InSb) and indium-arsenide (InAs).

10. The method of claim 9, wherein the middle layer is made from one of: undoped gallium arsenide (GaAs), slightly p-doped gallium arsenide (GaAs), indium phosphide (InP), gallium antimonide (GaSb), indium gallium antimonide (InGaSb), and indium aluminum antimonide (InAlSb).

11. A magnetoresistor sensor, comprising:
   a substrate;
   a bottom resistive layer on the substrate;
   a top resistive layer spaced and insulated from the bottom layer and electrically connected thereto;
   a common terminal electrically connected to the top and bottom layers;
   a sensing MR terminal electrically connected to only the top layer; and
   a reference resistor terminal electrically connected to only the bottom layer, a sensing magnetoresistor being established between the common terminal and the sensing MR terminal, a reference resistor being established between the common terminal and the reference resistor terminal.

12. The magnetoresistor sensor of claim 11, wherein the sensing magnetoresistor generates a temperature-dependant magnetic field signal and the reference resistor generates a reference signal useful for removing temperature dependencies from the magnetic field signal.

13. The magnetoresistor sensor of claim 12, further comprising:
   a signal processor receiving both signals and processing the magnetic field signal at least in part based on the reference signal.

14. The magnetoresistor sensor of claim 12, wherein the sensing magnetoresistor generates a temperature-dependant relative motion signal and the reference resistor generates a reference signal useful for removing temperature dependencies from the relative motion signal.

15. The magnetoresistor sensor of claim 12, further comprising:
   a signal processor receiving both signals and processing the relative motion signal at least in part based on the reference signal.

* * * * *